(12) United States Patent
Hsieh et al.

(10) Patent No.: US 7,179,120 B2
(45) Date of Patent: Feb. 20, 2007

(54) ELECTRICAL CONNECTOR HAVING POSITIONING MECHANISM

(75) Inventors: Jeffrey(Fu-Bin) Hsieh, Tu-Cheng (TW); Ming-Lun Szu, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/340,140

(22) Filed: Jan. 26, 2006

(65) Prior Publication Data

US 2006/0172594 A1  Aug. 3, 2006

(30) Foreign Application Priority Data

Jan. 28, 2005  (TW) .............................. 94201594 U

(51) Int. Cl.
*H01R 13/73* (2006.01)
(52) U.S. Cl. ...................................... 439/571; 439/342
(58) Field of Classification Search ................. 439/83, 439/82, 571, 342, 560, 572
See application file for complete search history.

(56) References Cited

U.S. PATENT DOCUMENTS

| | | | |
|---|---|---|---|
| 5,108,308 A * | 4/1992 | Northcraft et al. .......... 439/555 |
| 5,281,166 A * | 1/1994 | Yu et al. ..................... 439/571 |
| 6,024,603 A * | 2/2000 | Chen et al. .................. 439/571 |
| 6,146,152 A | 11/2000 | McHugh et al. |
| 6,164,978 A | 12/2000 | McHugh et al. |
| 6,179,624 B1 * | 1/2001 | McHugh et al. .............. 439/71 |
| 6,186,797 B1 | 2/2001 | Wang et al. |
| 6,196,849 B1 * | 3/2001 | Goodwin ..................... 439/71 |
| 6,203,331 B1 | 3/2001 | McHugh et al. |
| 6,244,875 B1 * | 6/2001 | McHugh et al. .............. 439/73 |
| 6,881,088 B2 * | 4/2005 | Gattuso et al. ............. 439/342 |
| 2004/0229503 A1 * | 11/2004 | Xu ............................. 439/571 |

* cited by examiner

*Primary Examiner*—Hien Vu
(74) *Attorney, Agent, or Firm*—Wei Te Chung

(57) ABSTRACT

According to an embodiment of the present invention, an LGA connector (10) for forming electrical connection between an LGA package and a circuit substrate includes a dielectric housing (20) defining a number of passages (2024) and a number of conductive terminals (30) seated in the corresponding passages, respectively. The dielectric housing is provided with a number of reinforced columns (2026) capable of being inserted into a number of recesses correspondingly defined in the circuit substrate, to favorably prevent the dielectric housing from being displaced relative to the circuit substrate.

5 Claims, 5 Drawing Sheets

ELECTRICAL CONNECTOR HAVING POSITIONING MECHANISM

BACKGROUND OF THE INVENTION

1. Field of the Invention

The present invention generally relates to the field of electrical connectors. More particularly, an embodiment of the present invention relates to an electrical connector having positioning mechanism for electrically connecting an integrated circuit package with a circuit substrate.

2. General Background

An integrated circuit package having a number of conductive pads arranged thereon in land grid array fashion is known as an LGA package. Electrical connectors for forming electrical connection between an LGA package and a circuit substrate are known as LGA connectors. Normally, an LGA connector includes a dielectric housing and a number of conductive terminals embedded within the dielectric housing. The conductive terminals each has a spring arm protruding out of the dielectric housing and deformable in both horizontal and vertical direction.

In use, the LGA package seated on the dielectric housing urges the spring arms of the conductive terminals to deflect downwardly and horizontally to resiliently and electrically mate with the corresponding conductive pads on the LGA package, which may induce frictional force between the conductive terminals and the LGA package and possibly conduce to horizontal displacement of the dielectric housing with respect to the circuit substrate.

In order to prevent the dielectric housing from being displaced with respect to the circuit substrate, certain LGA connectors are provided with a number of positioning columns integrally formed with the dielectric housing thereof. The materials set forth in connection with the present patent application describe LGA connectors-see, e.g., U.S. Pat. Nos. 6,146,152, 6,164,978, 6,179,624, 6,186,797, and 6,203,331, which are all hereby incorporated by references.

However, to securely position the LGA connector on the circuit substrate, the positioning columns integrally formed with the dielectric housing also need to bear a horizontal shearing force exerted by the circuit substrate to balance the frictional force between the LGA package and the conductive terminals, which may potentially lead to the positioning columns to break off from the dielectric housing and adversely affect the performance of the electrical interconnection between the LGA package and the circuit substrate.

Therefore, there is a heretofore unaddressed need in the industry to address the aforementioned deficiencies and inadequacies.

SUMMARY

According to an embodiment of the present invention, an electrical connector mountable on a circuit substrate includes a dielectric housing and a number of conductive terminals seated in the dielectric housing, respectively. The dielectric housing is provided with a number of reinforced columns capable of being inserted into a number of recesses correspondingly defined in the circuit substrate, so as to securely position the dielectric housing on the circuit substrate.

The embodiment of the present invention offers an electrical connector being formed with a number of reinforced columns capable of being inserted into a number of recesses correspondingly defined in the circuit substrate, which may possibly strengthen the dielectric housing and prevent the dielectric housing from being displaced relative to the circuit substrate.

The present invention is illustrated by way of example and not limitation in the figures of the appended drawings, in which like references indicate identical elements, and in which:

DETAILED DESCRIPTION OF THE EMBODIMENTS

In the following description, for purpose of explanation, numerous details are set forth in order to provide a thorough understanding of the embodiments of the present invention. However, it will be apparent to one skilled in the art that these specific details are not required in order to practice the embodiments of the present invention.

As illustrated in FIG. 1 to FIG. 5, a land grid array (LGA) connector 10 for electrically connecting an LGA package (not shown) with a circuit substrate (not shown) according to an embodiment of the present invention includes a dielectric housing 20 and a number of conductive terminals 30 seated in the dielectric housing 20, respectively. The dielectric housing 20 is provided with a number of reinforced columns 2026 capable of being inserted into a number of recesses (not shown) correspondingly defined in the circuit substrate, to securely position the dielectric housing 20 on the circuit substrate.

Figure 1:
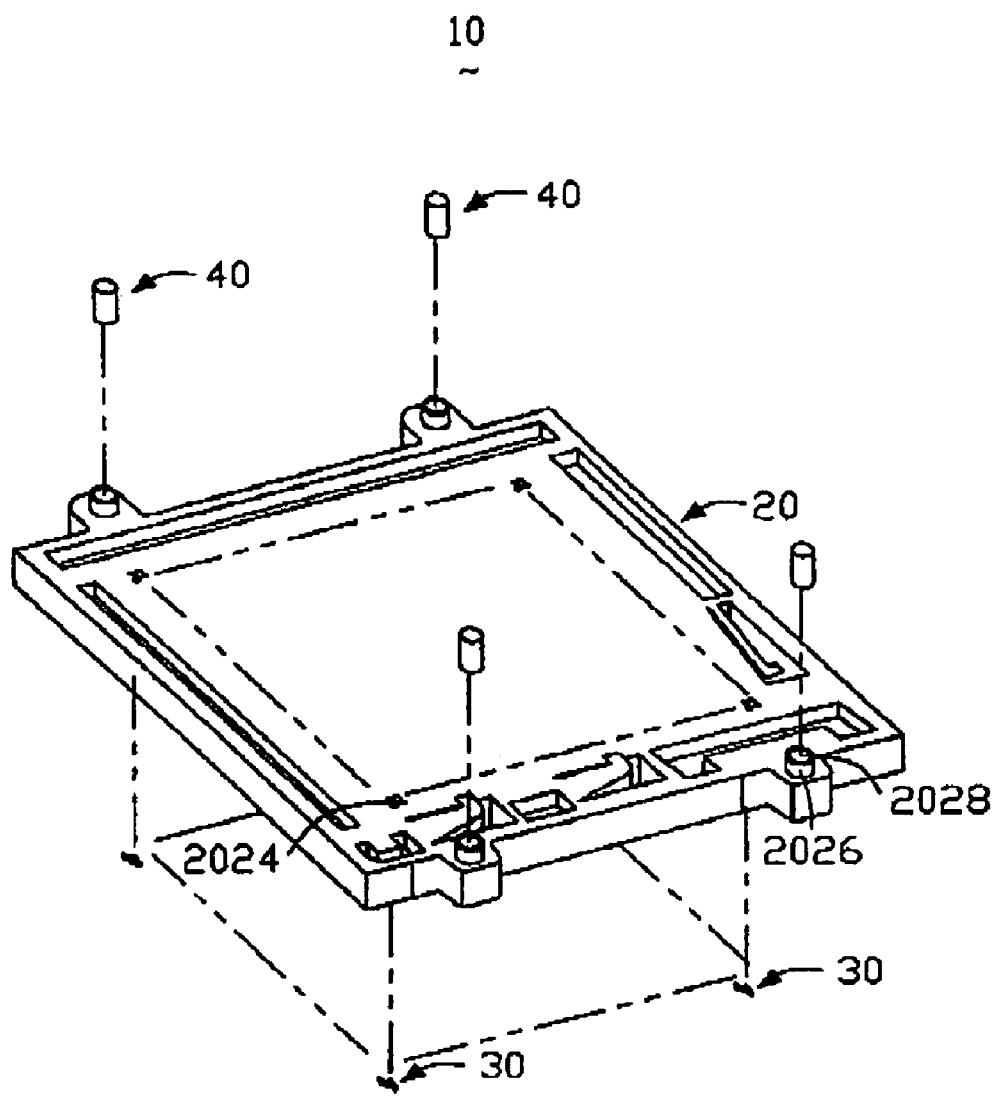
FIG. 1 illustrates an exemplary pre-assembled view of an LGA connector in accordance with an embodiment of the present invention.
Figure 2:
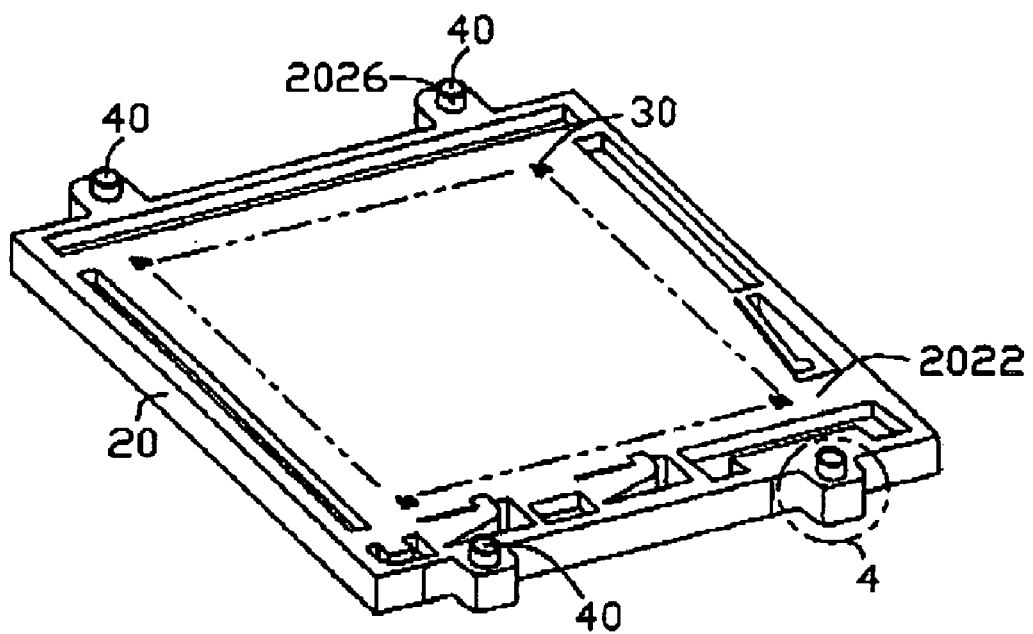
FIG. 2 illustrates an exemplary assembled view of the LGA connector of FIG. 1.
Figure 3:
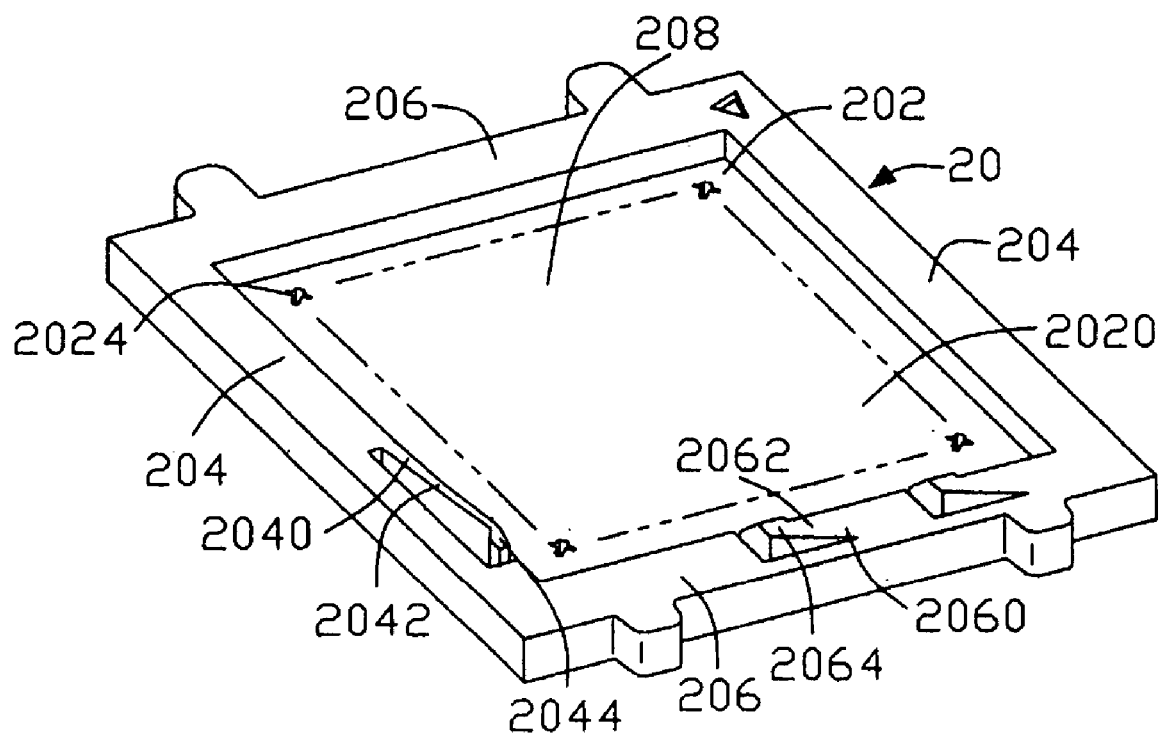
FIG. 3 illustrates an exemplary bottom view of a dielectric housing of the LGA connector illustrated in FIG. 1.

Individual elements of the LGA connector 10 will now be described in greater detail. As illustrated in FIG. 1 to FIG. 3, the dielectric housing 20 is made from electrically insulating materials, such as resin or the like, and constructed to a planar configuration. The dielectric housing 10 includes a bottom wall 202 and a pair of first sidewalls 204, a pair of second sidewalls 206 extending vertically from the bottom wall 202. The bottom wall 202 and the first and second sidewalls 204, 206 jointly define a receiving cavity 208 to accommodate the LGA package therein.

The bottom wall 202 includes a supporting surface 2020 adapted to hold the LGA package and a mounting surface 2022 opposite to the supporting surface 2020. A number of passages 2024 communicating the supporting surface 2020 and the mounting surface 2022 is defined in a desired pattern, such as a two dimensional matrix. A number of conductive terminals 30 are disposed in the corresponding passages 2024, respectively. The conductive terminal 30 each includes an upper flexible beam (not labeled) protruding into the receiving cavity 208 to resiliently and electrically register with a corresponding conductive pad (not shown) on the LGA package and a lower contacting section (not labeled) extending out of the mounting surface 2022 of the dielectric housing 20 to be electrically connected to the circuit substrate.

Figure 4:
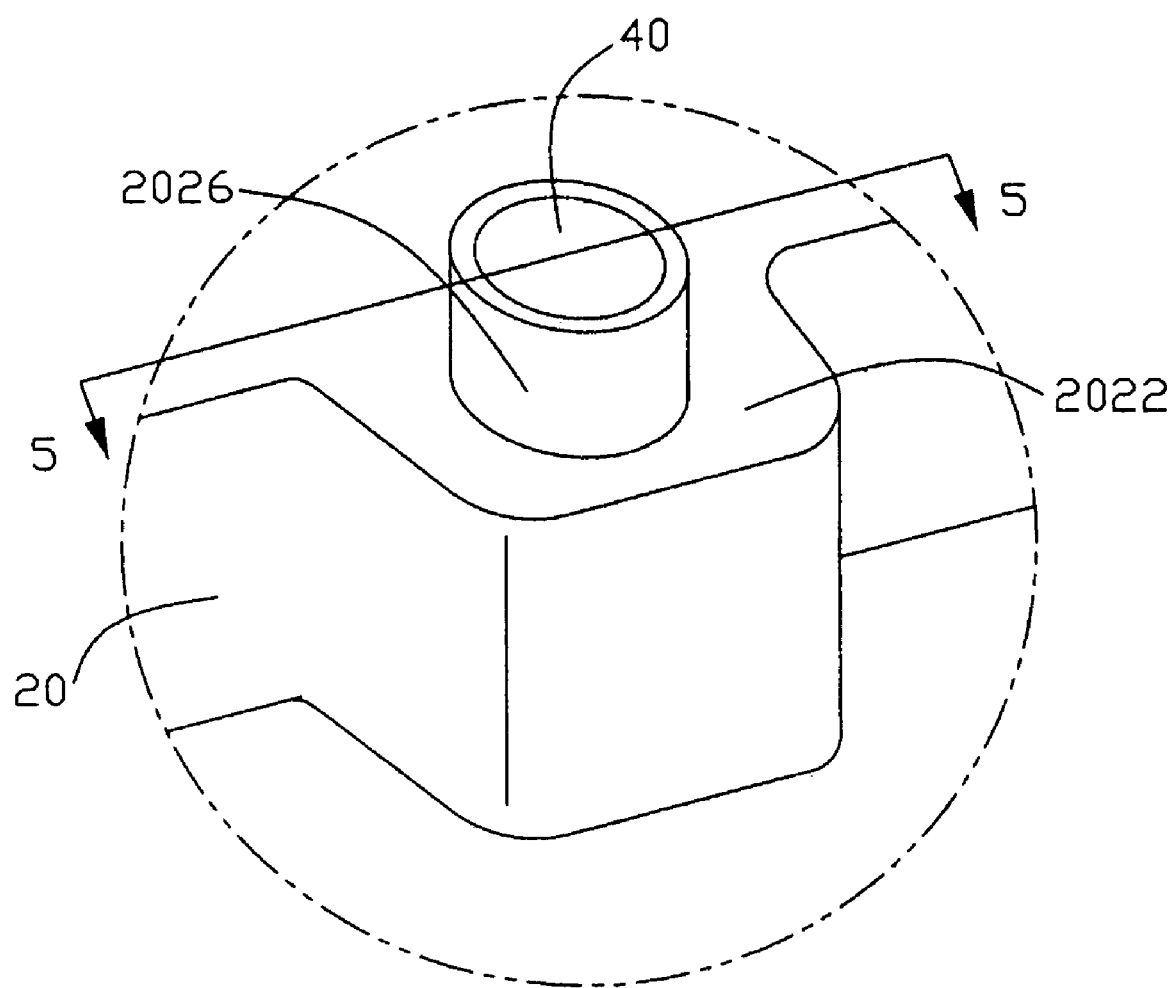
FIG. 4 illustrates an exemplary enlarged view of the circled portion 4 of FIG. 2.
Figure 5:
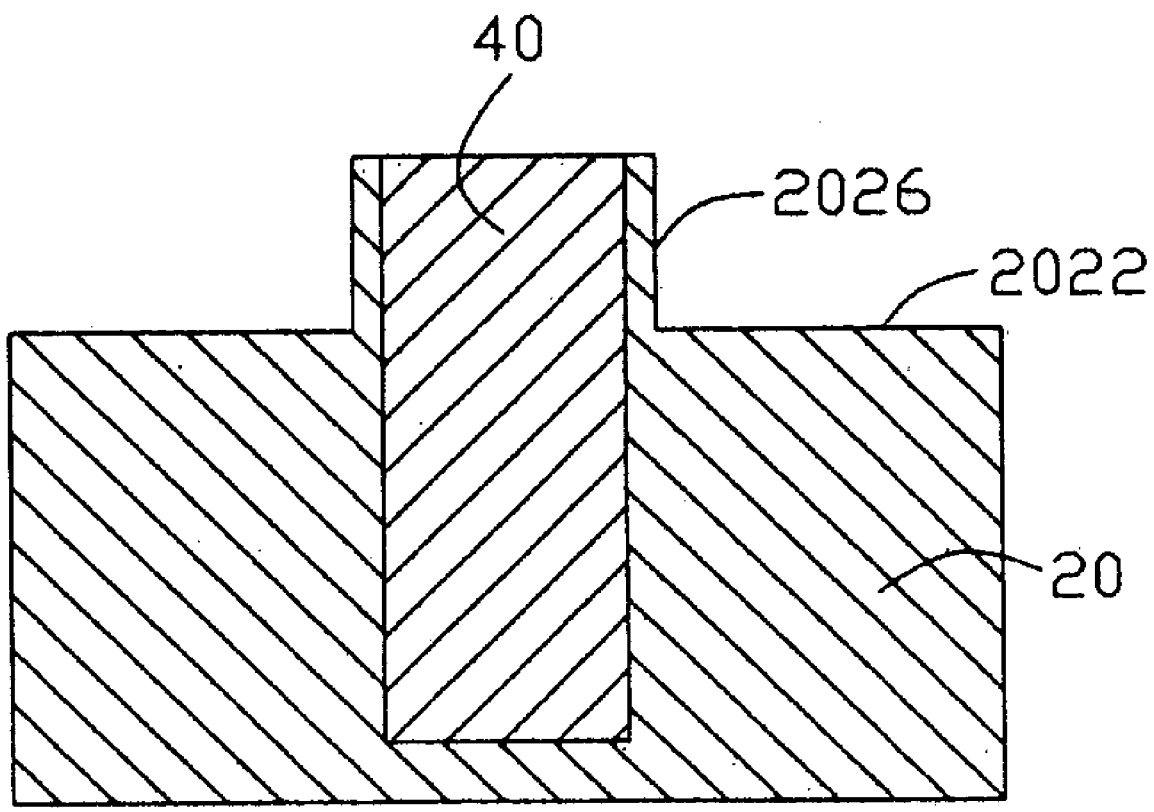
FIG. 5 illustrates an exemplary cross-sectional view taken along the line 5—5 of FIG. 4.

As illustrated in FIG. 4 and FIG. 5, a number of upstanding reinforced columns 2026 are located on a periphery of the mounting surface 2022. The reinforced columns 2026 can be inserted into the recesses correspondingly defined in the circuit substrate. In one embodiment of the present invention, a chamber 2028 is defined at a center of each reinforced column 2026. A reinforcing pin 40 is interferingly planted in the chamber 2028. The reinforcing pin 40 is preferably made from material with desirable strength and has a shape in compliance with that of the chamber 2028. Each reinforcing pin 40 extends away from the mounting surface 2022 along upper and lower sides relative thereto. In another embodiment of the present invention, the reinforcing pin 40 can also be retained in the dielectric housing 20 via insertion molding method.

As illustrated in FIG. 3, intersectant first sidewall 204 and second sidewall 206 are formed with a first flexible cantilevered beam 2040 and a second flexible cantilevered beam 2060, respectively. The first and second flexible cantilevered beams 2040, 2060 partly stretch into the receiving cavity 208 to resiliently resist against the LGA package. The first flexible cantilevered beam 2040 includes a first connecting portion 2042 jointed to the first sidewall 204 and a first abutting portion 2044 at a distal end thereof. The second flexible cantilevered beam 2060 includes a second connecting portion 2062 linked to the second sidewall 206 and a second abutting portion 2064 at a distal end thereof. The first and the second abutting portions 2044, 2064 extend into the receiving cavity 208 to jointly resiliently abut against the LGA package, so as to reliably retain the LGA package in the receiving cavity 208.

When the LGA connector 10 is coupled to the circuit substrate, the reinforced columns 2026 are inserted into the corresponding recesses defined in the circuit substrate, thereby realizing accurate positioning of the LGA connector 10 on the circuit substrate. The reinforcing pins 40 can strengthen the columns 2026 and prevent the columns 2026 from breaking off from the dielectric housing 20 due to repeated operation and fatigue.

While the present invention has been illustrated by description of embodiments thereof, and while the embodiments have been described in considerable detail, it is not intended to restrict or in any way limit the scope of the appended claims to such details. Additional advantages and modifications in the spirit and scope of the present invention will readily appear to one skilled in the art. Therefore, the present invention is not limited to the specific details and illustrative examples shown and described.

What is claimed is:

1. An LGA connector for electrically connecting an LGA package with a circuit substrate, the LGA connector comprising:
  a dielectric housing having a bottom wall having a mounting surface and a plurality of sidewalls jointly encircling a receiving cavity to receive the LGA package therein, the bottom wall being provided with a plurality of reinforced columns integrally formed from the mounting surface and extending outwardly toward the circuit substrate so as to securely position the dielectric housing thereon; and
  a plurality of conductive terminals embedded in the dielectric housing, respectively, each conductive terminal comprising an upper flexible beam protruding into the receiving cavity to resiliently and electrically mate with the LGA package;
  wherein the reinforced columns each comprise a chamber at a center thereof and a reinforcing pin interferingly inserted in the chamber wherein each of the reinforced columns is situated on a periphery of a bottom surface and adjacent to each of four corners of the dielectric housing; wherein each of the reinforced columns keeps a constant contour regardless of whether the corresponding metallic pin is received therein or not.

2. The LGA connector of claim 1, wherein a plurality of sidewalls each form a flexible cantilevered beam stretching into the receiving cavity to resiliently resist against the LGA package.

3. An LGA connector for electrically connecting an LGA package with a circuit substrate thereunder, the WA connector comprising:
  a dielectric housing having a bottom wall having a mounting face and a plurality of sidewalls jointly encircling a receiving cavity to receive the WA package therein, a plurality of laterally protruding sections formed on exterior surfaces of the sidewalls, and adjacent to four corner of the dielectric housing
  a plurality of metallic pins respectively extending downward from said laterally protruding sections for assembling to the circuit substrate; and
  a plurality of conductive terminals embedded in the dielectric housing, respectively, each conductive terminal comprising an upper flexible beam protruding into the receiving cavity to resiliently and electrically mate with the LGA package; wherein
  laterally protruding section keeps a constant contour regardless of whether the corresponding metallic pin is equipped therewith or not wherein each of said metallic pins is compactly enclosed within a hollow column of each respective protruding section, said each of the hollow columns being integrally formed with the mounting surface and the below the bottom wall of the housing.

4. The electrical connector of claim 3, wherein said hollow column keeps a constant contour regardless of whether the corresponding metallic pin is received therein or not.

5. The electrical connector of claim 4, wherein metallic pin does not communicate with an exterior upwardly.

* * * * *